(12) United States Patent
Shimura et al.

(10) Patent No.: US 7,485,568 B2
(45) Date of Patent: Feb. 3, 2009

(54) METHOD FOR FORMING WIRING OF SEMICONDUCTOR DEVICE

(75) Inventors: Satoru Shimura, Nirasaki (JP); Tetsu Kawasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 394 days.

(21) Appl. No.: 11/072,491

(22) Filed: Mar. 7, 2005

(65) Prior Publication Data

US 2005/0196953 A1    Sep. 8, 2005

(30) Foreign Application Priority Data

Mar. 8, 2004    (JP)    ............... 2004-063797

(51) Int. Cl.
*H01L 21/44* (2006.01)
*H01L 21/4763* (2006.01)

(52) U.S. Cl. ...................... 438/622; 438/637

(58) Field of Classification Search ......... 438/597–688, 438/725
See application file for complete search history.

(56) References Cited

U.S. PATENT DOCUMENTS

2001/0041462 A1 * 11/2001 Kashiwagi et al. .......... 438/787
2003/0091728 A1    5/2003 Ueda
2003/0170993 A1 *  9/2003 Nagahara et al. ............ 438/694
2003/0186537 A1 * 10/2003 Yamanaka et al. .......... 438/637
2004/0087139 A1 *  5/2004 Yeh et al. .................... 438/636
2004/0132291 A1 *  7/2004 Lee et al. .................... 438/689
2006/0042651 A1 *  3/2006 Verhaverbeke et al. ......... 134/1
2006/0094219 A1 *  5/2006 Soda ........................... 438/597
2006/0094234 A1 *  5/2006 Soda et al. ................... 438/638
2007/0026683 A1 *  2/2007 Chen et al. ................... 438/725

FOREIGN PATENT DOCUMENTS

JP    2002-083869 A    3/2002

* cited by examiner

*Primary Examiner*—Savitri Mulpuri
(74) *Attorney, Agent, or Firm*—Rader, Fishman & Grauer, PLLC

(57) ABSTRACT

According to the present invention, a connection hole is formed above a substrate by an etching treatment using a first resist film as a mask, and after the first resist film is removed by stripping, the substrate is exposed to a water vapor atmosphere. Thus, an amine component in the film is removed before formation of a second resist film for forming a wiring groove, thereby preventing contamination of the second resist film. The present invention is a method for forming wiring of a semiconductor device using a dual damascene method, in which the resist film for forming the wiring groove can be prevented from being contaminated with the amine component or the like.

3 Claims, 14 Drawing Sheets

FIG.3(A)  WATER VAPOR + OZONE GAS
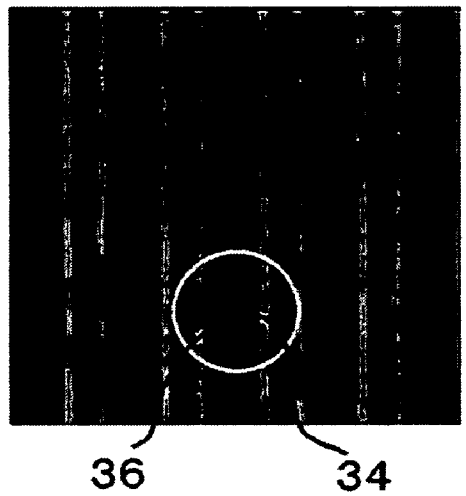
36  34
FIG.3(B)  NO TREATMENT

WATER VAPOR + OXYGEN GAS 36  34

CARBON-BASED TREATMENT SOLUTION

36

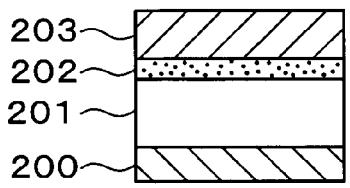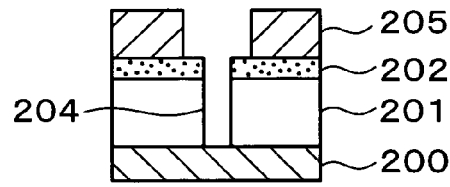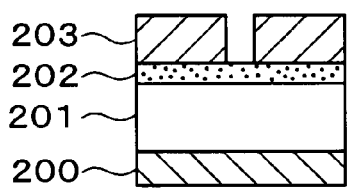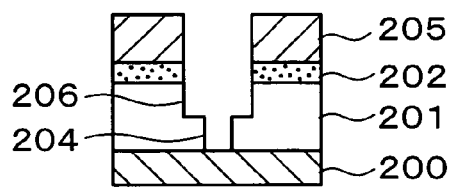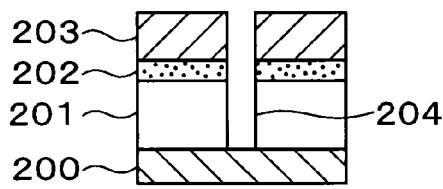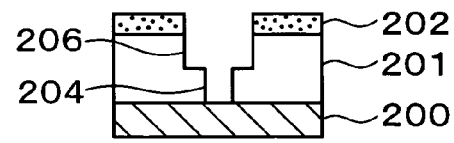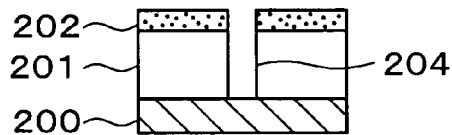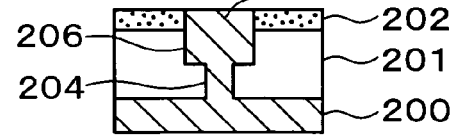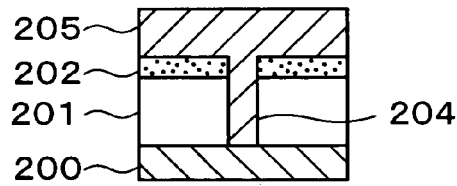

METHOD FOR FORMING WIRING OF SEMICONDUCTOR DEVICE

BACKGROUND OF THE INVENTION

1. Field of the Invention

The present invention relates to a method for forming wiring of a semiconductor device.

2. Description of the Related Art

For multilayer wiring to be formed, for example, in a semiconductor device such as a transistor, Cu wiring is applied to realize a high speed semiconductor device. As a method for forming the Cu wiring, a dual damascene method is used in which connection holes (for example, contact holes, via holes) and wiring grooves are formed in a multilayer film structure and then the connection holes and wiring grooves are filled with Cu material at a time. The dual damascene method has an advantage in that it has a smaller number of steps, so that the manufacturing cost can be reduced.

The method for forming Cu wiring using the conventional dual damascene method will be described here using FIGS. 13A to 13I. First of all, for example, a wiring layer 200, an interlayer insulation film 210, and an antireflection film 202 are formed on a substrate in order from the bottom, and a first resist film 203 is formed on the surface of a multilayer film structure composed of those layers (FIG. 13A). Then, the first resist film 203 is patterned into a predetermined pattern by the photolithography technique (FIG. 13B).

In this patterning step, the first resist film 203 is exposed to light under the predetermined pattern, and a resulting exposed portion is selectively removed by development. Subsequently, the antireflection film 202 and the interlayer insulation film 201 are etched by etching treatment using the first resist film 203 as a mask. Thus, a connection hole 204 is formed which leads to the wiring layer 200 from the surface of the multilayer film structure (FIG. 13C).

Then, the first resist film 203 which is unnecessary any longer is removed by stripping, for example, by ashing treatment (FIG. 13D), and a second resist film 205 for forming a wiring groove is newly formed instead (FIG. 13E).

The second resist film 205 is patterned by the photolithography technique (FIG. 13F), and then the antireflection film 202 and the interlayer insulation film 201 are partially etched by the etching treatment using the second resist film 205 using as a mask.

Thus, a wiring groove 206 is formed which communicates with the connection hole 204 and is larger in width than the connection hole 204 (FIG. 13G). The second resist film 205 which is unnecessary any longer is removed by stripping (FIG. 13H), and the connection hole 204 and the wiring groove 206 are filled with Cu material, thus forming a Cu wiring 207 (FIG. 13I) (Japanese Patent Laid-open No. 2002-83869).

Conventionally, the above-described ashing treatment when removing the first resist film 203 has been performed by supplying a nitrogen gas and a hydrogen gas or an ammonia gas into a treatment container to expose the substrate to the atmosphere. Therefore, during the ashing treatment, a very small amount of ammonia component has been sometimes absorbed in the interlayer insulation film 201 exposed due to the connection hole 204. Also in the interlayer insulation film 201 such as a low dielectric constant film itself, which often contains nitrogen atoms in its compositional components, a very small amount of basic amine has been generated, for example, during film formation and remained.

As described above, the interlayer insulation film 201 has often contained the amine component at the time when the first resist film 203 is removed by stripping. Incidentally, there is another conceivable factor of absorption of the amine component into the interlayer insulation film 203, such as use of an ammonium fluoride-based or amine-based treatment solution, for example, when the first resist film 203 is removed with the treatment solution, or generation of the amine component, for example, when the etching for formation of the connection hole or cleaning of the connection hole is performed.

Accordingly, when the second resist film 205 is formed after the removal by stripping of the first resist film 203, the amine component in the interlayer insulation film 201 permeates the adjacent second resist film 205, whereby the second resist film 205 is contaminated with the amine component. In the patterning step of the second resist film 205 to be performed thereafter, the exposure generates an acid catalyst in the resist film, and the action of the acid catalyst accelerates the solubility of the exposed portion to a developing solution, so that the exposed portion is selectively etched by development. Accordingly, if the second resist film 205 is contaminated with the amine component as described above, the acid catalyst in the second resist film 205 reacts with the amine component to lose its function as the acid catalyst. For this reason, the second resist film 205 has not sufficiently patterned, thus causing a portion of the second resist film 205 to remain as shown in FIG. 14 which should be removed normally. In this case, the subsequent etching treatment using the second resist film 205 as a mask has not been properly performed, failing to form the wiring groove 206 in a proper shape.

SUMMARY OF THE INVENTION

The present invention has been developed in consideration of the above viewpoint, and its object is to prevent contamination of a second resist film with a basic material such as an amine component or the like in a method for forming wiring of a semiconductor device using a dual damascene method.

The present invention has been developed to achieve the above-described object. The present invention is a method for forming wiring of a semiconductor device using a dual damascene method, including the steps of: forming a connection hole above a substrate by an etching treatment using a first resist film as a mask; then removing the first resist film; then forming a second resist film above the substrate; and then forming a wiring groove by an etching treatment using the second resist film as a mask, the method further including, between the step of removing the first resist film and the step of forming the second resist film above the substrate, a step of exposing the substrate to a water vapor atmosphere.

The inventor confirmed that contamination of the second resist film is prevented by exposing the substrate to the water vapor atmosphere before formation of the second resist film, whereby patterning of the second resist film is properly performed. It can be reasoned that the amine component in an interlayer insulation film is absorbed by the water vapor to be removed before formation of the second resist film. As a result of this, the connection hole and the wiring groove are formed in proper shapes to form a desired wiring.

The water vapor atmosphere may be mixed with a gas having oxidative action. In this case, for example, the amine component in the film can be effectively removed. Incidentally, the gas having oxidative action may be an ozone gas. The water vapor atmosphere may be generated from a magnetized water activated by magnetism. Also in this case, for example, the amine component in the film can be effectively removed by the activated water vapor.

According to another aspect of the present invention, a silane-based gas may be supplied to the substrate after the first resist film is removed by stripping and before the second resist film is formed. The present inventor confirmed that contamination of the second resist film is prevented by supplying a silane-based gas to the substrate before formation of the second resist film, whereby the patterned state of the second resist film is improved.

According to still another aspect of the present invention, a developing solution may be supplied to the substrate after the first resist film is removed by stripping and before the second resist film is formed. The present inventor confirmed that contamination of the second resist film is prevented by supplying a developing solution to the substrate before formation of the second resist film, whereby the patterned state of the second resist film is improved.

According to yet another aspect of the present invention, a carbon-based treatment solution may be supplied to the substrate after the first resist film is removed by stripping and before the second resist film is formed. The present inventor confirmed that contamination of the second resist film is prevented by supplying a carbon-based treatment solution to the substrate before formation of the second resist film, whereby the patterned state of the second resist film is improved.

According to the present invention, contamination of a resist film can be prevented and wiring can be properly formed, thus improving yields and quality of semiconductor devices.

BRIEF DESCRIPTION OF THE DRAWINGS

FIGS. 3A and 3B are photographs showing respective formation states of wiring grooves when the substrate is exposed to a water vapor containing ozone and when the substrate is not exposed;

FIGS. 13A to 13I are explanatory views for explaining a process by a conventional dual damascene method.

DETAILED DESCRIPTION OF THE INVENTION

Figure 1:
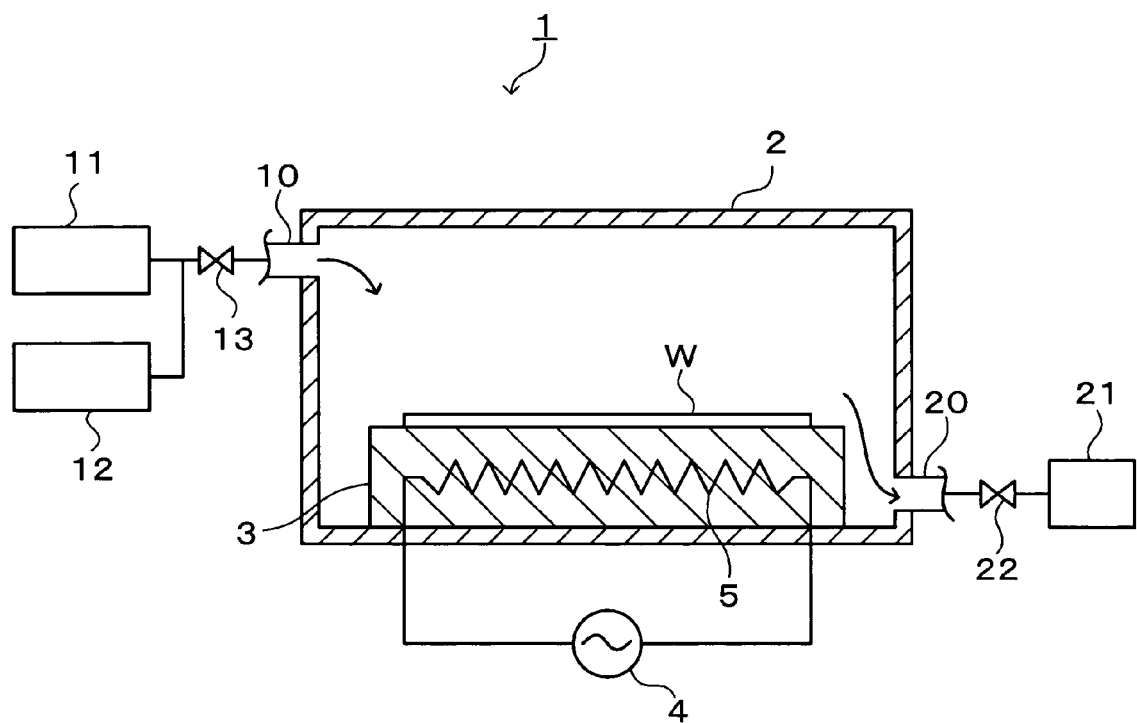
FIG. 1 is an explanatory view of a longitudinal section showing the outline of a configuration of a substrate treatment apparatus for use in a method for forming Cu wiring according to the present embodiment.

Hereinafter, preferred embodiments of the present invention will be described. FIG. 1 is an explanatory view of a longitudinal section showing the outline of a configuration of a substrate treatment apparatus 1 for removing an amine component from an interlayer insulation film in a method for forming wiring of a semiconductor device of the present invention.

The substrate treatment apparatus 1 includes, for example, a mounting table 3 for mounting a substrate W thereon in a closable treatment container 2. Inside the mounting table 3, a heater 5 is incorporated which generates heat by feeding of electricity from an electricity feeder 4 located outside the substrate treatment apparatus 1. The heater 5 can heat the substrate W on the mounting table 3 to a predetermined temperature.

For example, to a side wall portion of the treatment container 2, a gas supply pipe 10 is connected. The gas supply pipe 10 is connected, for example, to a water vapor supply unit 11 which generates and sends out, for example, water vapor. The gas supply pipe 10 also branches at a midpoint to be connected also to an ozone gas supply unit 12 which generates and sends out an ozone gas having oxidative action. A predetermined amount of the ozone gas can be mixed into the water vapor supplied from the water vapor supply unit 11, and the resulting water vapor can be introduced into the treatment container 2. The gas supply pipe 10 is provided with, for example, a gas supply valve 13 which allows the water vapor to be introduced into the treatment container 2 at a predetermined timing.

An exhaust pipe 20 is connected, for example, to a side wall portion of the treatment container 2 opposite the gas supply pipe 10. The exhaust pipe 20 is connected to an exhaust unit 21 having an exhaust pump. The exhaust pipe 20 is provided with an exhaust valve 22. This configuration allows the atmosphere in the treatment container 2 to be exhausted at a predetermined timing and at a predetermined pressure.

Figure 2A:
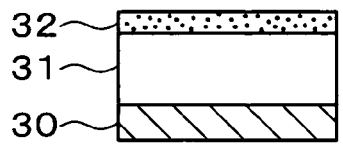
FIGS. 2A to 2I are explanatory views showing a multilayer film structure on a substrate changing following a Cu wiring formation process.

Next, a method for forming Cu wiring using the dual damascene method according to the present invention will be described following FIGS. 2A to 2I. First of all, on a wiring film 30 made of a Cu material on a substrate W, an interlayer insulation film 31 having a low dielectric constant composed of, for example, a compound containing nitrogen atoms such as $SiN_4$, SiCN, SiC, or the like, and an antireflection film 32 are formed in order from the bottom (FIG. 2A). The interlayer insulation film 31 and the antireflection film 32 are formed using, for example, a CVD method, a sputtering method, or the like.

Figure 2B:
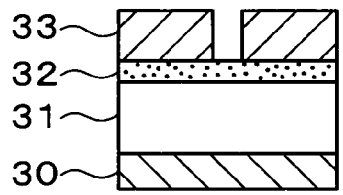
Figure 2C:
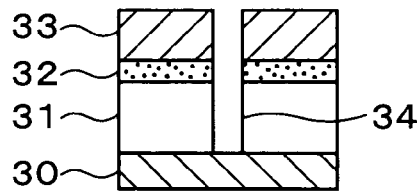

Next, on the antireflection film 32, a resist solution is applied so that a first resist film 33 is formed and then patterned by the photolithography method (FIG. 2B). Incidentally, the photolithography processing of this embodiment employs light having an exposure wavelength of, for example, 248 nm. When the first resist film 33 is patterned, etching using the first resist film 33 as a mask is performed to form a connection hole 34 leading to the wiring film 30 passing through the interlayer insulation film 31 and the antireflection film 32 (FIG. 2C).

Figure 2D:
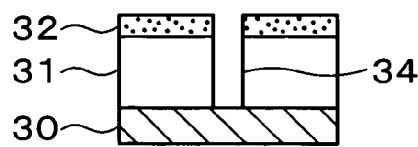
Figure 2E:
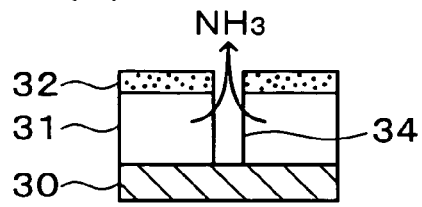

After the etching is finished, the first resist film 33 is removed by stripping, for example, by an ashing treatment (FIG. 2D). By the action of an ammonia gas or a nitrogen gas and a hydrogen gas, and so on used in the removal, an amine component may be incorporated into the first resist film 33.

After the ashing treatment is finished, the substrate W is carried into the substrate treatment apparatus 1 and mounted on the mounting table 3 which has been increased in temperature by the heater 5 as shown in FIG. 1. This increases the temperature of the substrate W, for example, to about 100° C. to about 200° C. When the substrate W is mounted on the mounting table 3 and stabilized at a predetermined temperature, for example, the exhaust valve 22 and the gas supply valve 13 are opened, so that the water vapor containing ozone gas is introduced into the treatment container 2 while the atmosphere in the treatment container 2 is being exhausted. Thus, the treatment container 2 maintains the atmosphere of the water vapor containing ozone gas therein to expose the substrate W to the water vapor atmosphere. In this event, for example, the amine component in the interlayer insulation film 31 is absorbed by the water vapor and the like and oxidized by the ozone to be removed, for example, from the interlayer insulation film 31.

When the substrate W is exposed to the water vapor atmosphere in a predetermined period of time so that the amine component is removed therefrom, the supply and exhaustion of the water vapor and the ozone gas are stopped. Thereafter, the substrate W is carried out of the substrate treatment apparatus 1 and subsequently subjected to Cu wiring formation processing.

Figure 2F:
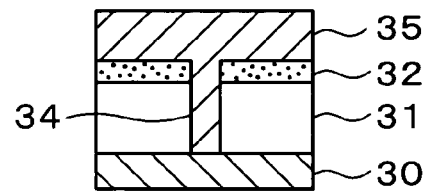
Figure 2G:
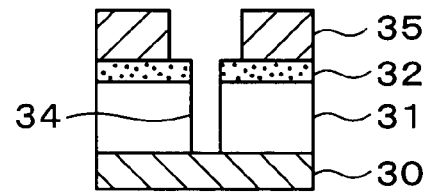
Figure 2H:
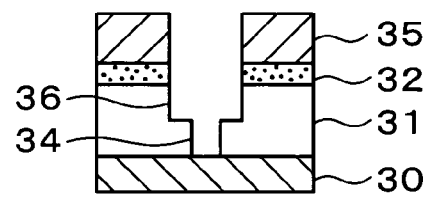

A resist solution is applied onto the surface of the substrate W from which the amine component has been removed, whereby a second resist film 35 is formed on the antireflection film 32 (FIG. 2F). Then, the second resist film 35 is patterned by the photolithography method to form a wiring groove (FIG. 2G). After the second resist film 35 is patterned, the second resist film 35 is etched so that portions of the antireflection film 32 and the interlayer insulation film 31 are removed, whereby a wiring groove 36 is formed which has a predetermined depth leading to the connection hole 34 (FIG. 2H).

Figure 2I:
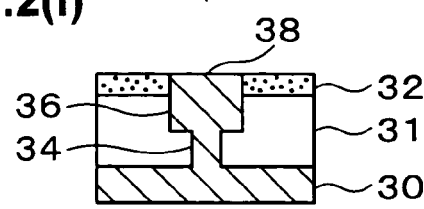

The second resist film 35 is removed by stripping by the ashing treatment, and then the connection hole 34 and the wiring groove 36 are filled with a Cu material, thus forming a Cu wiring 38 (FIG. 2I).

FIGS. 3A and 3B show experimental results each using a substrate containing a large amount of amine component in a film such as the interlayer insulation film 31 or the like, showing a final formation state of the wiring groove 36 and the connection hole 34 when the first resist film 33 was removed by stripping and then the substrate W was exposed to the water vapor atmosphere containing ozone gas (FIG. 3A) and a formation state of the wiring groove and the like when no treatment was performed (FIG. 3B).

When no treatment was performed after the first resist film 33 was removed by stripping as shown in FIG. 3B, formation of the wiring groove 36 and the connection hole 34 was not observed at all for the last time. In contrast to the above, when the substrate W was exposed to the water vapor atmosphere containing ozone gas as shown in FIG. 3A, the state of the wiring groove 36 and the connection hole 34 was improved relative to that in the case of FIG. 3B, and it can be confirmed that the wiring groove 36 and so on were properly formed. Incidentally, this case employed light having an exposure wavelength of 248 nm in the photolithography processing, and a similar tendency was confirmed also in a case employing light having an exposure wavelength of 193 nm.

According to the above embodiment, the whole substrate W is exposed to the water vapor atmosphere containing ozone gas after the removal of the first resist film 33 is finished, whereby the subsequent patterning of the second resist film 35 and etching using the second resist film 35 as a mask can be properly performed to form the Cu wiring having the wiring groove 36 and the connection hole 34 in predetermined shapes. It can be reasoned that the amine component in the interlayer insulation film 31 is removed by the water vapor before formation of the second resist film 35, thus avoiding the amine component from interfering with the action of an acid catalyst accelerating the solubility of the second resist film 35 to a developing solution in the photolithography step, whereby the second resist film 35 is properly patterned.

Although the ozone gas is mixed into the water vapor to be supplied into the treatment container 2 of the substrate treatment apparatus 1 in the above embodiment, another gas having oxidative action, for example, an oxygen gas, a hydrogen peroxide gas, or the like may be mixed in place of the ozone gas.

Figure 4:
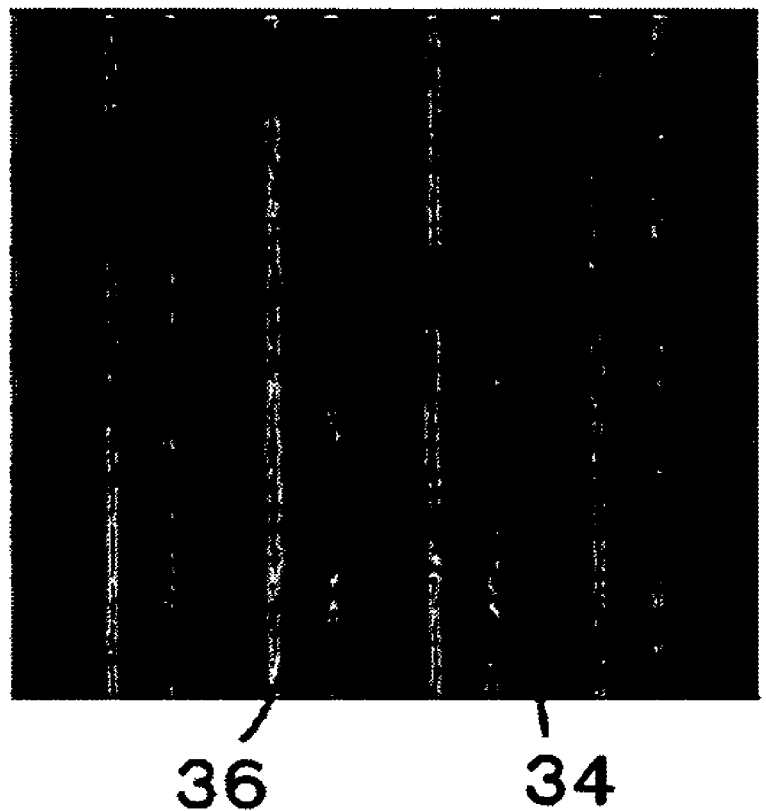
FIG. 4 is a photograph showing a formation state of a wiring groove when the substrate is exposed to a water vapor containing oxygen.

Even when the oxygen gas is mixed into the water vapor as shown in FIG. 4, it can be confirmed that the formation state of the wiring groove 36 and the connection hole 34 can be improved. Alternatively, the water vapor to be supplied into the treatment container 2 of the substrate treatment apparatus 1 may be mixed with liquid having oxidative action in a mist form, for example, a mist of hydrogen peroxide solution in place of the gas having oxidative action. Further, to further accelerate the removal of the amine component, the water vapor may be generated from an activated water, for example, a magnetized water activated by magnetism, and the resulting water vapor may be supplied into the treatment container 2. Note that only the water vapor may be supplied into the treatment container 2 with nothing mixed into the water vapor.

Only the gas having oxidative action, for example, the ozone gas may be supplied, in place of the water vapor, into the treatment container 2 of the substrate treatment apparatus 1, and in this case, the effect of removal of the amine component has also been confirmed. Further, only liquid having oxidative action in a mist form, for example, mist of hydrogen peroxide solution may be supplied, in place of the water vapor, into the treatment container 2 of the substrate treatment apparatus 1. In this case, a mist generator for the hydrogen peroxide solution is connected to the gas supply pipe 10.

Figure 5:
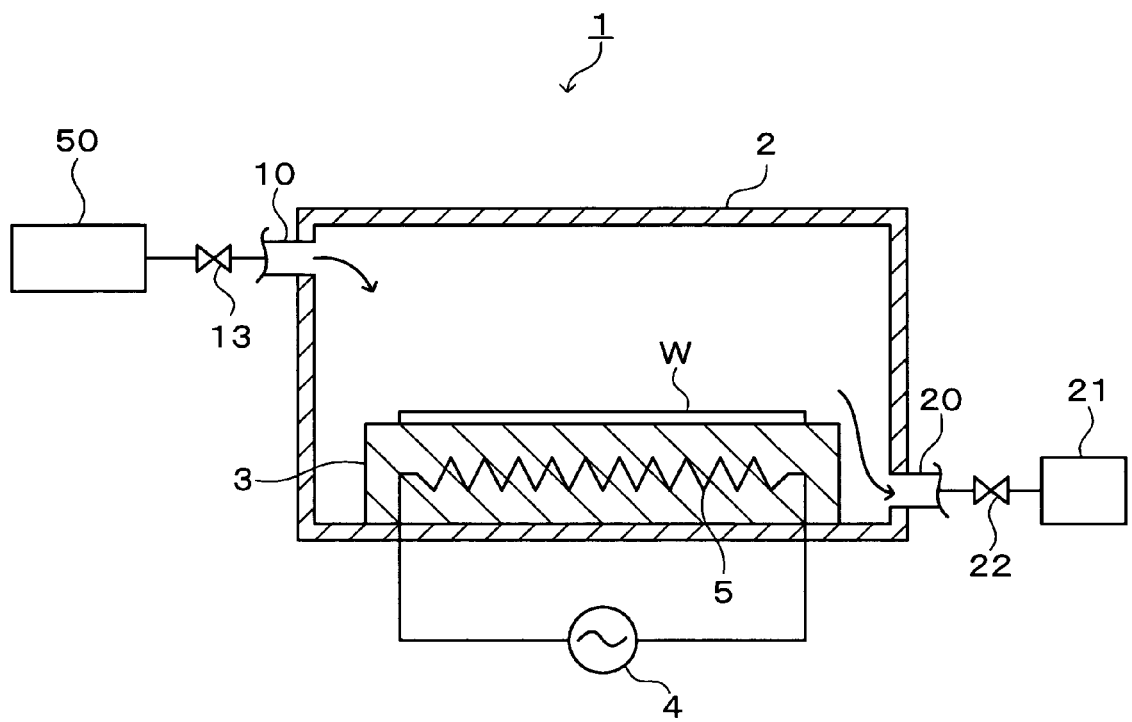
FIG. 5 is an explanatory view of a longitudinal section showing the outline of a configuration of a substrate treatment apparatus which supplies a silane-based gas into a treatment container.

Although the substrate W is exposed to the water vapor atmosphere after the stripping removal treatment of the first resist film 33 is finished in the above embodiment, the substrate W may be exposed to an atmosphere of a silane-based gas in place of the water vapor. In this case, for example, a silane-based gas supply unit 50 which supplies a silane-based gas is connected to the gas supply pipe 10 of the treatment container 2 as shown in FIG. 5. Note that examples of the silane-based gas material to be used include, for example, DMSDMA (Dimethyl silyl dimethylamine),
HMDS (Hexamethyldisilazane),
TMDS (1,1,3,3-Tetra methyldisilazane),
DMSDEA (Dimethylsilyldiethylamine),
TMSDMA (Trimethylsilyldimethylamine),
TMSDEA (Trimethyl silyldiethylamine),
DMAPMDS (N,N-Dimethyl aminopenta methyldisilane),
DMADMDS (N,N-Dimethylamino-1,2-dimethyldisilane),
TDACP (2,2,5,5-Tetramethyl-2,5-disila-1-azacyclopentane),
TDOCP (2,2,5,5-Tetramethyl-2,5-disila-1-oxocyclopentane),
B[DMA]MS (Bis(dimethylamino)methylsilane),
B[DMA]DS (Bis(dimethylamino)dimethylsilane), HMCTS (1,1,3,3,5,5-Hexamethylcyclotrisilazane), and the like.

When the first resist film 33 is removed by stripping, the substrate W is carried into the treatment container 2 and mounted on the mounting table 3 to be heated to a predetermined temperature. Then, for example, the exhaust valve 22 is opened to reduce the pressure inside the treatment container 2 to a predetermined pressure. When the pressure inside the treatment container 2 is reduced, the supply valve 13 is opened to introduce the silane-based gas into the treatment container 2 from the silane-based gas supply unit 50. Thus, the treatment container 2 is filled with the silane-based gas so that the substrate W is exposed to the silane-based gas.

Figure 6:
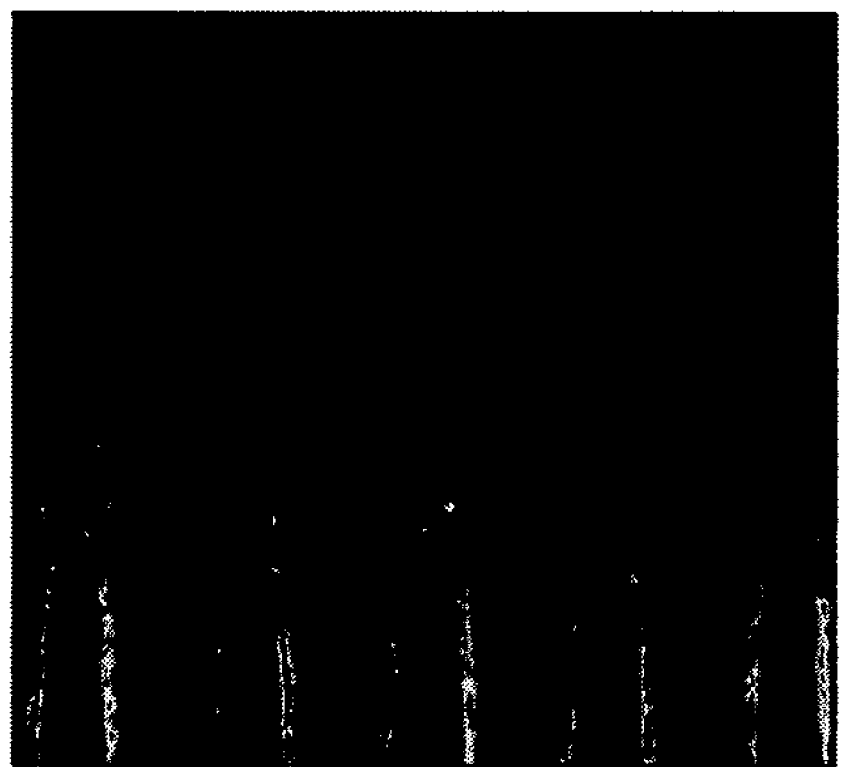
FIG. 6 is a photograph showing a state of a wiring groove when the substrate is exposed to the silane-based gas.

FIG. 6 shows a state of the wiring groove 36 when the substrate W is exposed to the silane-based gas, from which it can be confirmed that the wiring groove 36 surely appears relative to the case where no treatment was performed (FIG. 3B) as in the prior art, showing an improved state of the wiring groove 36. It can be reasoned that the amine component in the interlayer insulation film 31 was removed by the silane-based gas, whereby the second resist film 35 was properly patterned as a result and the etching thereafter was properly performed. Consequently, according also to this embodiment, it is possible to form the connection hole 34 and the wiring groove 36 more properly relative to the prior art so as to form a desired Cu wiring.

Figure 7:
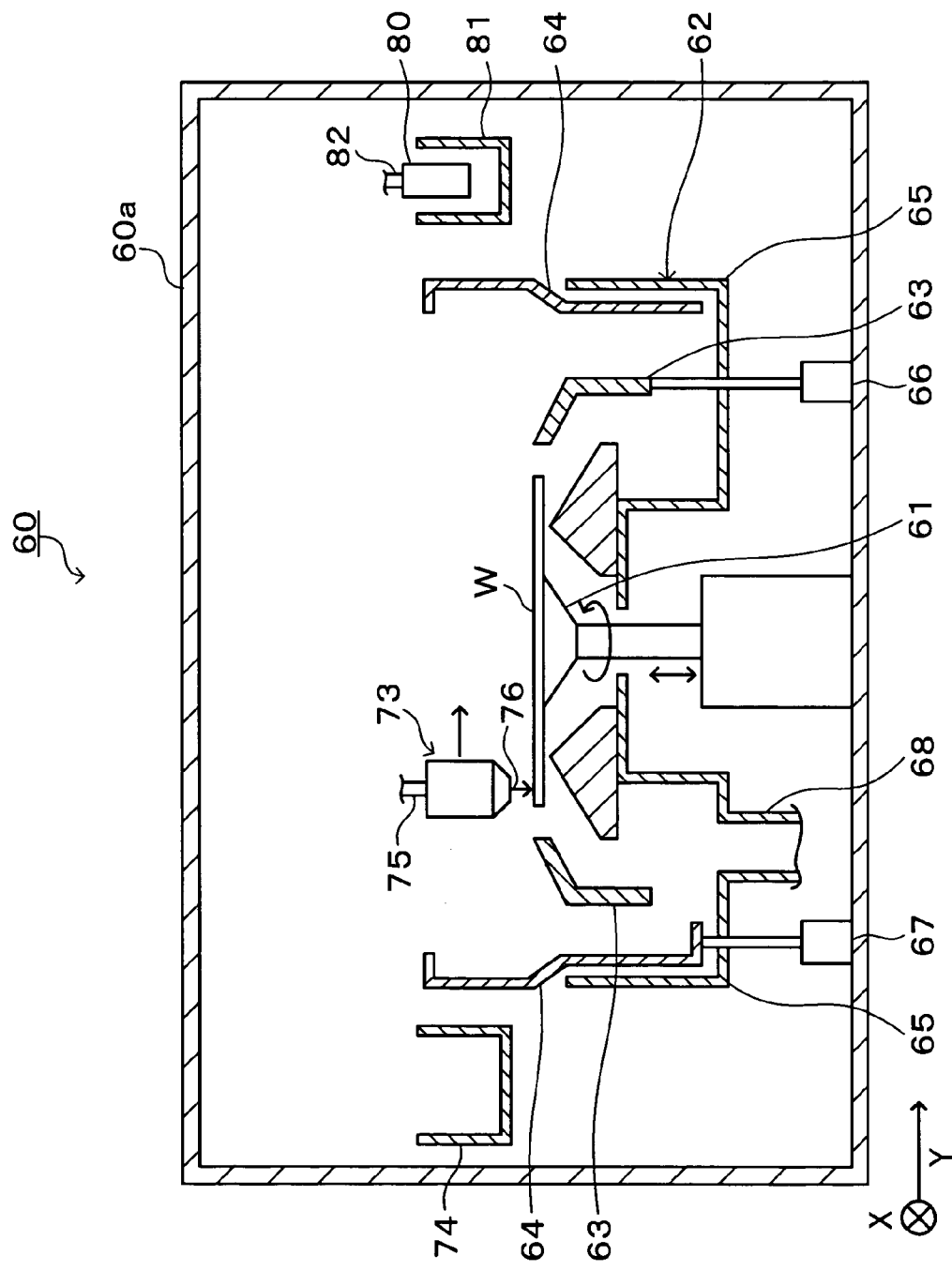
FIG. 7 is an explanatory view of a longitudinal section showing the outline of a configuration of a substrate treatment apparatus which can supply a developing solution to the substrate.

Although the substrate W is exposed to the atmosphere of the water vapor or the silane-based gas after the stripping removal treatment of the first resist film 33 is finished in the above embodiment, a developing solution may be supplied to the substrate W instead of exposing the substrate W to the water vapor or the silane-based gas. FIG. 7 is an explanatory view of a longitudinal section showing the outline of a configuration of a substrate treatment apparatus 60 in that case, and FIG. 8 is an explanatory view of a cross section of the substrate treatment apparatus 60.

As shown in FIG. 7, the substrate treatment apparatus 60 has a casing 60a in which a spin chuck 61 is provided which holds and rotates the substrate W. Around the spin chuck 61, a cup 62 is provided for receiving and collecting liquid spun off or dropping from the substrate W. The cup 62 has, for example, an inner cup 63 surrounding the periphery of the spin chuck 61, an outer cup 64 covering the outside of the inner cup 63, and a bottom cup 65 covering the lower surfaces of the inner cup 63 and the outer cup 64 in a separate manner.

The inner cup 63 is formed in a substantially cylindrical shape and its upper end portion is inclined upward to the inside. The inner cup 63 can be moved upward and downward, for example, by a raising and lowering drive unit 66 such as a cylinder. The outer cup 64 is formed in a square tube as seen from the top, for example, as shown in FIG. 8. The outer cup 64 can be moved upward and downward, for example, by a raising and lowering drive unit 67 such as a cylinder as shown in FIG. 7. To the bottom cup 65, a drain pipe 68 is connected which communicates, for example, with a drainage section of a factory so that the liquid collected by the cup 62 can be drained from the drain pipe 68 to the outside of the substrate treatment apparatus 60.

Figure 8:
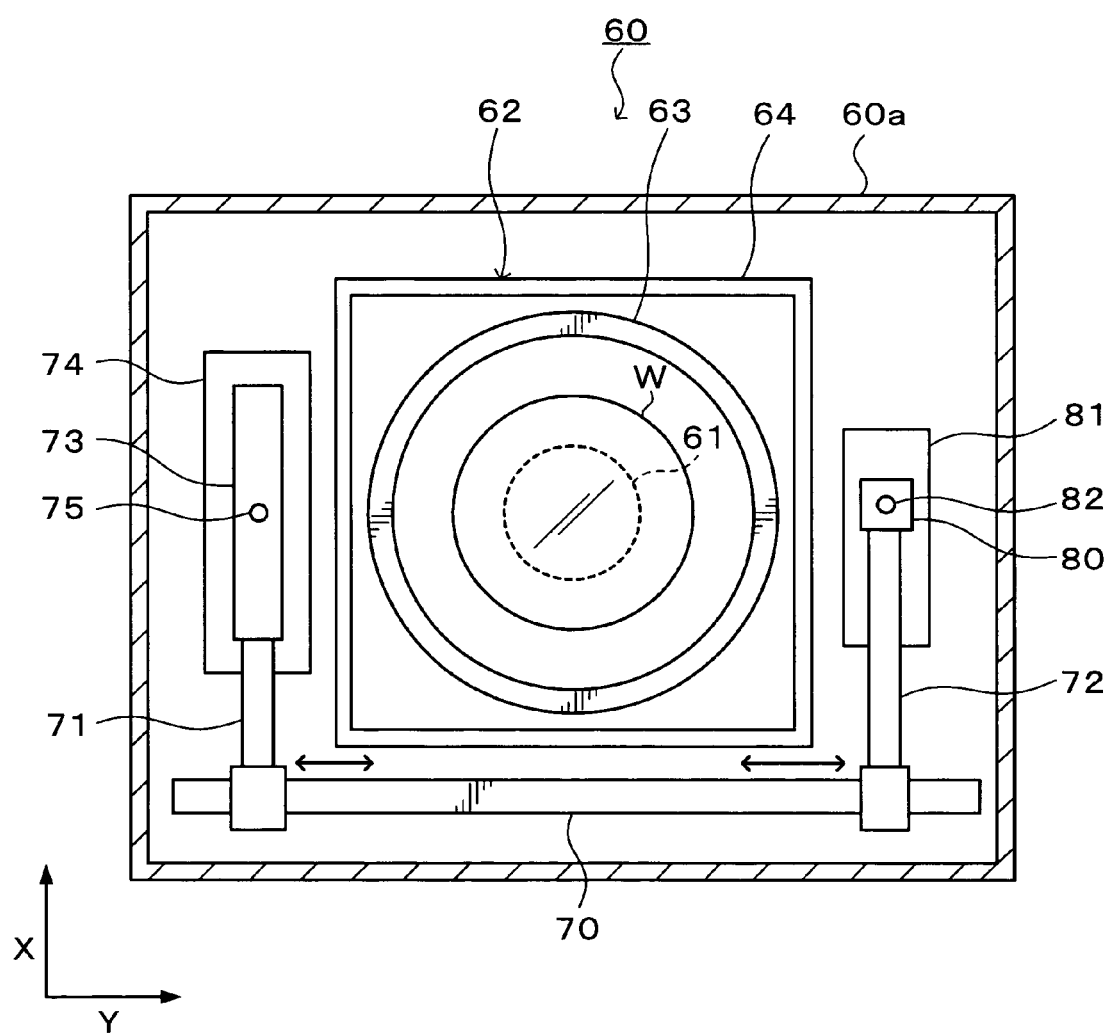
FIG. 8 is an explanatory view of a cross section of the substrate treatment apparatus in FIG. 7.

As shown in FIG. 8, a rail 70 extending along a Y-direction (the right-left direction in FIG. 8) is formed on the side of a negative direction in an X-direction of the cup 62 (the lower direction in FIG. 8). To the rail 70, two arms 71 and 72 are attached which are freely movable along the rail 70. On the first arm 71, a developing solution supply nozzle 73 is supported and can move from a waiting portion 74 provided outside the cup 62 on the side of the negative direction in the Y-direction (the left direction in FIG. 8) at least to an end portion of the cup 62 on the side of a positive direction in the Y-direction (the right direction in FIG. 8).

The developing solution supply nozzle 73 has an elongated shape along the X-direction, for example, equal to or longer than the diameter dimension of the substrate W as shown in FIG. 8. As shown in FIG. 7, a supply pipe 75 communicating with a not-shown developing solution supply unit is connected to the top portion of the developing solution supply nozzle 73. The bottom portion of the developing solution supply nozzle 73 is formed with a plurality of discharge ports 76 which are formed in a line along the longitudinal direction of the nozzle. The developing solution supply nozzle 73 is configured to allow a developing solution introduced from the supply pipe 75 at the top portion thereof to pass through the inside of the developing solution supply nozzle 73 and to be uniformly discharged from the discharge ports 76 at the bottom portion thereof.

On the second arm 72, a rinse solution supply nozzle 80 for cleaning the substrate W is supported as shown in FIG. 8 and can move from a waiting portion 81 provided outside the cup 62 on the side of the positive direction in the Y-direction to a position above the center of substrate W in the cup 62. The rinse solution supply nozzle 80 communicates a not-shown rinse solution supply unit provided outside the substrate treatment apparatus 60 via a rinse solution supply pipe 82 and thus can discharge downward the rinse solution supplied from the rinse solution supply unit.

Then, in the substrate treatment apparatus 60 configured as described above, when the substrate W from which the first resist film 33 has been removed by stripping is carried in, the substrate W is held by suction on the spin chuck 61 as shown in FIG. 7. Subsequently, the developing solution supply nozzle 73 waiting at the waiting portion 74 moves toward the side of the positive direction in the Y-direction to a position just before the end portion of the substrate W on the side of the negative direction in the Y-direction as seen from the top. Then, the developing solution supply nozzle 73 is lowered and brought closer to the surface of the substrate W. The developing solution supply nozzle 73 discharges the developing solution and moves, while discharging the developing solution, to the outside of the end portion of the substrate W on the side of the positive direction in the Y-direction. Thus, the developing solution is supplied over the surface of the substrate W, that is, the substrate surface where the connection hole 34 is formed and the interlayer insulation film 31 and the antireflection film 32 are exposed.

After a lapse of a predetermined period of time with the developing solution supplied on the substrate W, the rinse solution supply nozzle 80 waiting at the waiting portion 81 moves to the position above the center of the substrate W and discharges the rinse solution onto the substrate W. Concurrently with that, the spin chuck 61 rotates the substrate W to thereby spin off the developing solution on the substrate W from the substrate W, so that the substrate W is cleaned. Thereafter, the supply of the rinse solution is stopped, and the substrate W is rotated at a high speed, whereby the substrate W is dried by spin. The dried substrate W is carried out of the substrate treatment apparatus 60 and returned to the above-described Cu wiring formation process, in which the second resist film 35 is formed on the substrate surface.

Figure 9:
FIG. 9 is a photograph showing a state of a wiring groove when the developing solution is supplied to the substrate.

FIG. 9 shows a state of the wiring groove 36 when the developing solution is supplied onto the substrate W, from which it can be confirmed that the wiring groove 36 surely appears relative to the case where no treatment was performed (FIG. 3B) as in the prior art, showing an improved state of the wiring groove 36. It can be reasoned that the amine component in the interlayer insulation film 31 was removed by the supply of the developing solution, whereby the second resist film 35 was properly patterned and the etching using the second resist film 35 as a mask was properly performed. Consequently, according to this embodiment, it is possible to form the wiring groove 36 and the connection hole 34 more properly relative to the prior art so as to form a desired Cu wiring.

Figure 10:
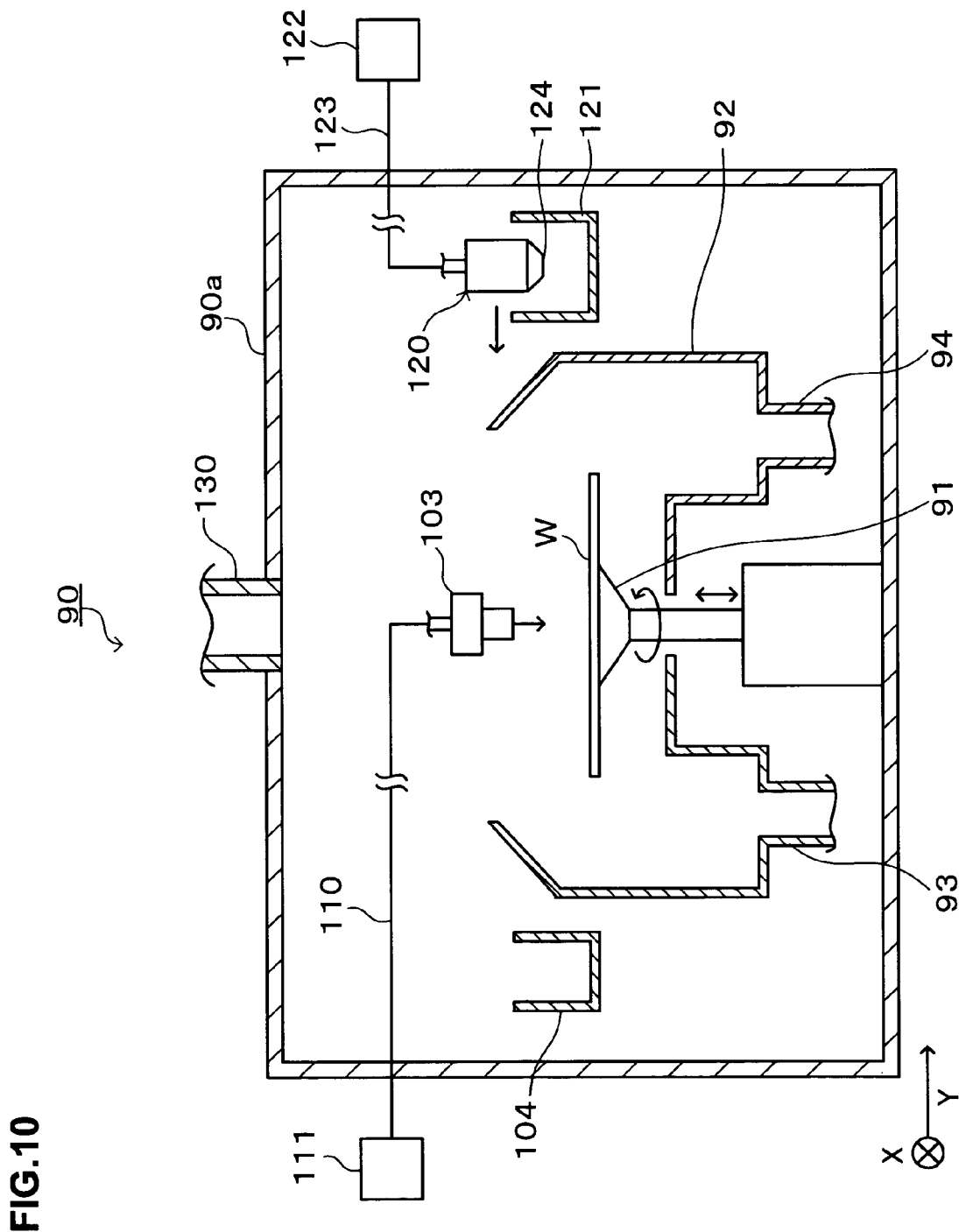
FIG. 10 is an explanatory view of a longitudinal section showing the outline of a configuration of a substrate treatment apparatus which can supply a carbon-based treatment solution to the substrate.

Although the developing solution is supplied onto the substrate W in the above embodiment, a carbon-based (organic compound) treatment solution may be supplied in place of the developing solution. FIG. 10 is an explanatory view of a longitudinal section showing a configuration example of a substrate treatment apparatus 90 for use in that case, and FIG. 11 is an explanatory view of a cross section of the substrate treatment apparatus 90.

As shown in FIG. 10, the substrate treatment apparatus 90 has, for example, a casing 90a in which a spin chuck 91 for holding by suction and rotating the substrate W is provided at the center portion. Around the spin chuck 91, a cup 92 is provided for receiving and collecting liquid spun off from the substrate W. The cup 92 has a substantially cylindrical shape with its upper face open and is formed to surround lateral and lower portions of the substrate W on the spin chuck 91. To the bottom surface of the cup 92, a drain pipe 93 for draining collected liquid and an exhaust pipe 94 for exhausting the cup 94 are connected.

Figure 11:
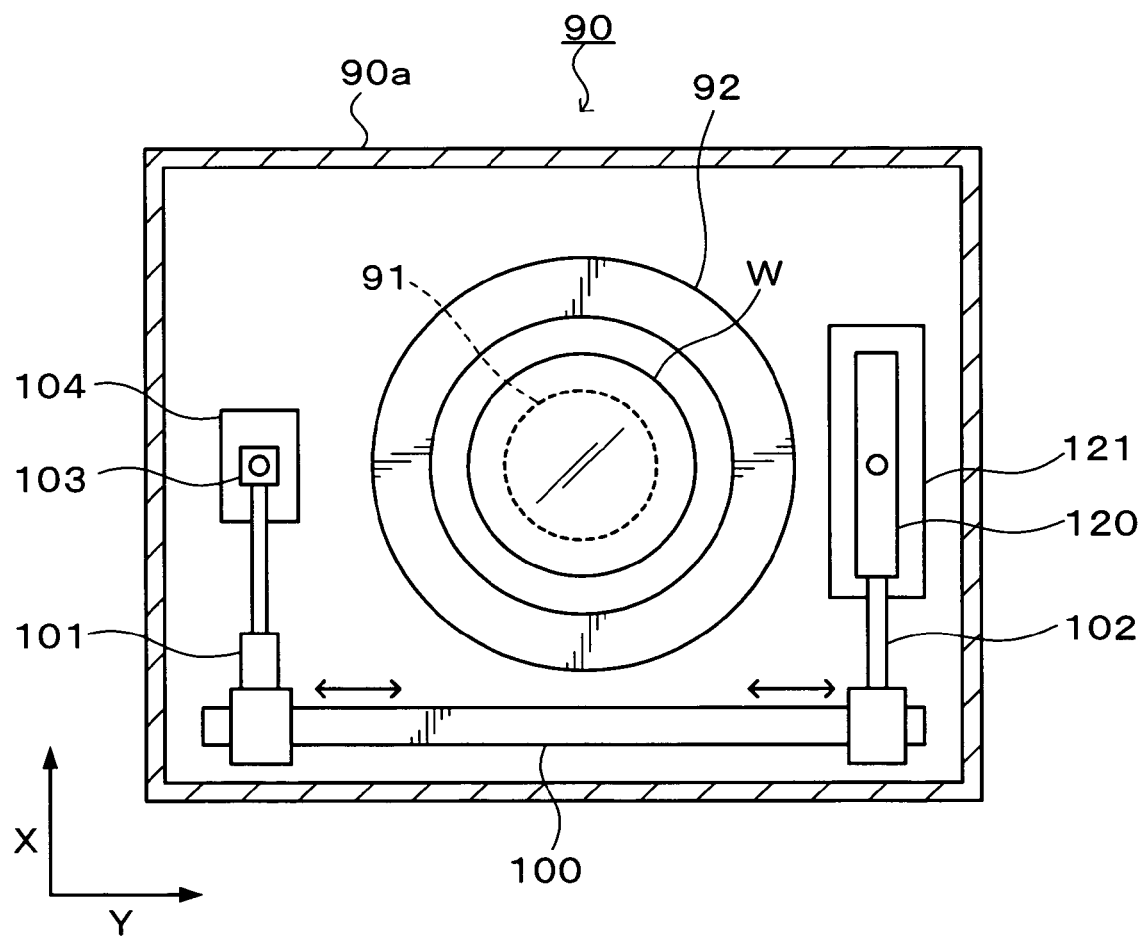
FIG. 11 is an explanatory view of a cross section of the substrate treatment apparatus in FIG. 10.

As shown in FIG. 11, a rail 100 extending along a Y-direction (the right-left direction in FIG. 11) is formed on the side of a negative direction in an X-direction of the cup 92 (the lower direction in FIG. 8). To the rail 100, for example, two arms 101 and 102 are attached which are freely movable along the rail 100. On the first arm 101, a treatment solution supply nozzle 103 for discharging a carbon-based treatment solution is supported and can move from a waiting portion 104 provided outside the cup 92 on the side of the negative direction in the Y-direction (the left direction in FIG. 11) to a position above the center of substrate W in the cup 92.

The treatment solution supply nozzle 103 is connected to a treatment solution supply unit 111 via a treatment solution supply pipe 110 as shown in FIG. 10. The treatment solution supply nozzle 103 can discharge downward the carbon-based treatment solution supplied from the treatment solution supply unit 111. Note that examples of the carbon-based treatment solution to be used include, for example, cyclized-rubber-bisazide-based, DNQ (diazo-naphthoquinon)-novolac-based, and chemically amplified resist solutions.

As shown in FIG. 11, on the second arm 102, a solvent supply nozzle 120 is supported which discharges a solvent dissolving the carbon-based treatment solution. The solvent supply nozzle 120 can move from a waiting portion 121 provided outside the cup 92 on the side of the positive direction in the Y-direction at least to an end portion of the cup 92 on the side of negative direction in the Y-direction. The solvent supply nozzle 120 has an elongated shape along the X-direction, for example, equal to or longer than the diameter dimension of the substrate W. As shown in FIG. 10, a solvent supply pipe 123 communicating with a solvent supply unit 122 is connected to the top portion of the solvent supply nozzle 120. The bottom portion of the solvent supply nozzle 120 is formed with a plurality of solvent discharge ports 124 which are formed in a line along the longitudinal direction of the nozzle. The solvent supply nozzle 120 is configured to allow a solvent introduced from the solvent supply pipe 123 at the top portion thereof to pass through the inside of the solvent supply nozzle 120 and to be uniformly discharged from the solvent discharge ports 124 at the bottom portion thereof.

As shown in FIG. 10, a duct 130 is connected to the top surface of the casing 90a which introduces gas regulated in temperature and humidity and cleaned and thus can introduce a predetermined gas to maintain a predetermined atmosphere in the casing 90a during the treatment of the substrate W.

In the substrate treatment apparatus 90 configured as described above, when the substrate W from which the first resist film 33 has been removed by stripping is carried in, the substrate W is held by suction on the spin chuck 91. Subsequently, the treatment solution supply nozzle 103 waiting at the waiting portion 104 moves toward the side of the positive direction in the Y-direction to a position above the center of the substrate W. The spin chuck 91 rotates the substrate W, and the treatment solution supply nozzle 103 discharges a carbon-based treatment solution onto the center of the rotated substrate W. The carbon-based treatment solution discharged on the substrate W is spread by centrifugal force and applied over the entire surface of the substrate W. It can be considered that the supply of the carbon-based treatment solution removes the amine component from the interlayer insulation film 31 and the antireflection film 32 on the substrate W.

Subsequently, the solvent supply nozzle 120 waiting at the waiting portion 121 moves toward the side of the negative direction in the Y-direction to a position just before the end portion of the substrate W on the side of the positive direction in the Y-direction as seen from the top. Then, the solvent supply nozzle 120 discharges the solvent for the carbon-based treatment solution and moves, while discharging the solvent, to the outside of the end portion of the substrate W on the side of the negative direction in the Y-direction. Thus, the solvent is applied over the entire surface of the substrate W. Subsequently, the spin chuck 91 rotates the substrate W to thereby spin off the carbon-based solution and the solvent on the substrate W, so that the substrate W is cleaned. Thereafter, the substrate W is rotated at a high speed, whereby the substrate W is dried by spin. The dried substrate W is carried out of the substrate treatment apparatus 90 and returned to the above-described Cu wiring formation process, in which the second resist film 35 is formed on the substrate surface.

Figure 12:
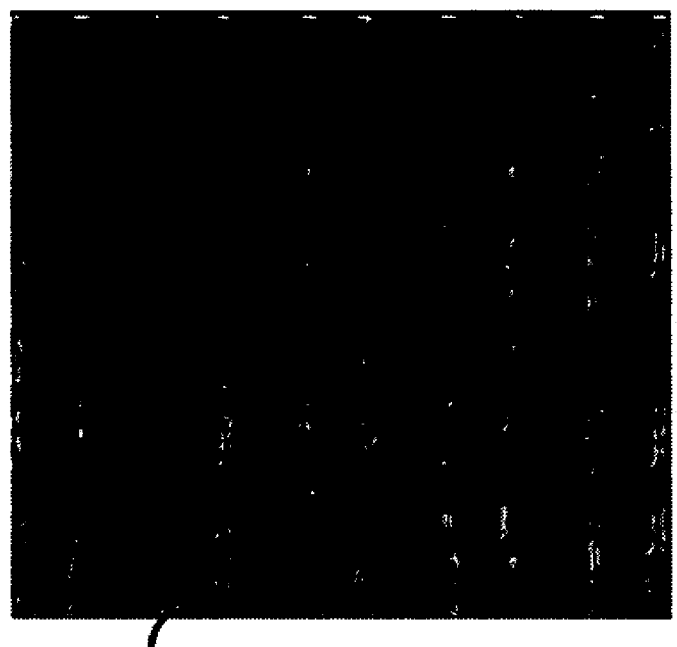
FIG. 12 shows a state of a wiring groove when the carbon-based treatment solution is supplied to the substrate.
Figure 14:
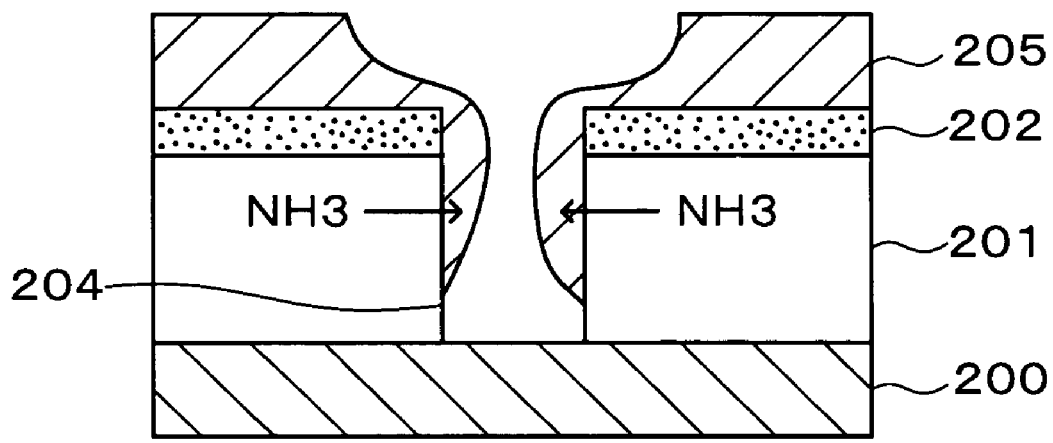
FIG. 14 is a longitudinal section of a multilayer film structure of a substrate showing a state in which a second resist film remains which should be removed normally.

FIG. 12 shows a state of the wiring groove 36 when the carbon-based treatment solution is supplied onto the substrate W as in the above-described embodiment, from which it can be found that the state of the wiring groove 36 is improved relative to the case where no treatment was performed (FIG. 3B) as in the prior art. According to this embodiment, the patterning of the second resist film 35 and the etching using the second resist film 35 as a mask are performed more properly relative to the prior art, whereby the wiring groove 36 and the connection hole 34 can be formed in desired shapes to form a proper Cu wiring.

Note that the configurations of the treatment solution supply nozzle 103 and the solvent supply nozzle 120 described in the above-described embodiments are not limited to the above-described ones, nozzle having other configurations are adaptable. For example, the solvent supply nozzle 120 may be a nozzle which is formed in a substantially cylindrical form similarly to the treatment solution supply nozzle 103 to discharge a solvent to the top at the center of the substrate W. In this case, the solvent can be supplied over the entire substrate surface by rotating the substrate W.

The above-described embodiments show examples of the present invention, and the present invention is not limited to those examples, but may employ various forms. For example, the present invention is applicable not only to the case of forming the structure of Cu wiring described in the above-described embodiments but also to the case of forming Cu wiring in other structures. Further, the present invention is also applicable to any substrates such as a wafer, an FPD (flat panel display) substrate, a mask substrate, a reticle substrate, and so on.

The present invention is useful in forming a wiring groove and a connection hole in proper shapes in manufacture of a multilayer wiring structure using the dual damascene method.

What is claimed is:

1. A method for forming wiring of a semiconductor device using a dual damascene method, comprising the steps of:
    forming a connection hole above a substrate by an etching treatment using a first resist film as a mask;
    then removing the first resist film;
    then forming a second resist film above the substrate; and
    then forming a wiring groove by an etching treatment using the second resist film as a mask,
    said method further comprising, between said step of removing the first resist film and said step of forming the second resist film above the substrate, a step selected from a group of
    (1) exposing the substrate to a water vapor atmosphere generated from a magnetized water invaded by magnetism,
    (2) supplying a silane-based gas to the substrate,
    (3) supplying a developing solution to the substrate, and
    (4) supplying a carbon-based treatment solution to the substrate.

2. The method for forming wiring as set forth in claim 1, wherein
    the water vapor atmosphere is mixed with a gas having oxidative action.

3. The method for forming wiring as set forth in claim 2, wherein
    the gas having oxidative action is an ozone gas.

* * * * *